United States Patent [19]

Dias et al.

[11] Patent Number: 4,651,303
[45] Date of Patent: Mar. 17, 1987

[54] NON-VOLATILE MEMORY CELL

[75] Inventors: Donald R. Dias, Carrollton; Patrick R. Antaki, Dallas, both of Tex.

[73] Assignee: Thomson Components—Mostek Corporation, Carrollton, Tex.

[21] Appl. No.: 778,640

[22] Filed: Sep. 23, 1985

[51] Int. Cl.⁴ .............................................. G11C 11/40
[52] U.S. Cl. ..................................... 365/185; 365/154
[58] Field of Search ................ 365/154, 185, 189, 182

[56] References Cited
U.S. PATENT DOCUMENTS
4,103,348 7/1978 Fagan .................................. 365/182

Primary Examiner—James W. Moffitt
Attorney, Agent, or Firm—Roland Plottel

[57] ABSTRACT

A volatile/non-volatile integrated circuit memory cell combines a non-volatile cell (110) connected to a volatile cell (105) at a volatile node (118), in which data recall is effected through a DC-stable arrangement of transistor (142), (145) and (146) that does not employ a capacitor to hold down the storage node.

3 Claims, 3 Drawing Figures

NON-VOLATILE MEMORY CELL

DESCRIPTION

1. Technical Field

The field of the invention is that of integrated circuit memories, in particular those that combine a non-volatile memory cell with a volatile memory cell, data being transferred from the non-volatile cell to the volatile cell.

2. Background Art

In shadow memories and other non-volatile memory circuits, a constant problem has been the efficient and reliable recall of data from the non-volatile cell to the volatile cell. The prior art has typically lowered the voltage on the power supply terminal in the memory array and then raised that voltage, relying on a capacitive imbalance to bring the volatile memory up into the correct data state. All of these prior art approaches have been succeptable to a problem in that dV/dt is required to exceed some threshold value. This also is a statistical process, meaning that statistical fluctuations may bias the cell in the wrong state. Designing a cell with a sufficient margin of safety tends to result in a cumbersome layout.

DISCLOSURE OF INVENTION

The invention relates to an improved non-volatile/-volatile memory cell employing active recall, in which the volatile cell is reliably forced into the same data state as the non-volatile cell, regardless of which data state the non-volatile cell is in, by an active recall scheme that is DC-stable.

BEST MODE OF CARRYING OUT THE INVENTION

Figure 1A:
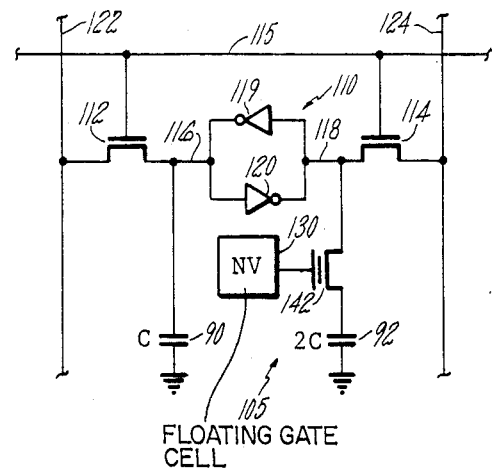
FIGS. 1a and 1b illustrate two prior art volatile/non-volatile memory cells.

Referring to FIG. 1a, there is shown a portion of a memory array that, in this case, is a shadow RAM cell in which a conventional volatile static RAM cell 110 is combined with a non-volatile cell 105, such as a floating-gate tunnel oxide memory cell. Word line 115 crosses horizontally in the upper portion of the cell and column lines 122 and 124 travel vertically along the boundaries of the cell. RAM cell 110 comprises cross-coupled inverters 119 and 120 having nodes 116 and 118 at the intersection points of the inverters. Nodes 116 and 118 are connected by pass transistors 112 and 114 respectively to column lines 122 and 124. The operation of this static RAM cell is conventional and is well known to those skilled in the art. This operation, for storing and recalling volatile data, is essentially unaffected by the presence of the remainder of the memory cell, referred to generally by the numeral 105. This remainder consists of a first capacitor 90 connected between node 116 and ground and a floating-gate transistor 142 controlled by non-volatile cell 130 and connected between node 119 and a first plate of a second capacitor 92 which, in turn, is connected between transistor 142 and ground. This second capacitor 92 has a capacitance that is illustratively 2C. In recall, the power supply to inverters 119 and 120 is dropped to ground, leaving the cell 110 quiescent at ground. The power supply is ramped up in voltage at a specified rate that has a dV/dt exceeding some threshold that is characteristic of the circuit. During this time, capacitance C of capacitor 90 will affect the charging time and the rate of charging of node 116 and of the transistor gates connected to it. If non-volatile cell 130 has stored a zero voltage on its floating-gate so that floating-gate transistor 142, which is controlled by cell 130, is turned off, then the capacitance on node 118 will only be the stray capacitance associated with the inverters and the pass transistor. Capacitor 90 has been selected to have a considerably greater capacitance than this stray capacitance and node 118 will rise faster in voltage than node 116, so that cell 110 ramps up with node 118 at a high voltage. If, however, non-volatile cell 130 has stored a high voltage, turning transistor 142 on, then the capacitance on node 118 is that of capacitor 92 which is conventionally twice as much as the capacitance of capacitor 90. In this case, node 118 rises in voltage more slowly than node 116 and cell 110 ramps up with node 118 low and node 116 high. Thus, the data within non-volatile memory 130 is recalled, with a reliability that depends upon the statistical fluctuations in the current flowing into nodes 116 and 118, since the ramping process is a positive feedback process that very quickly fixes on which of the two nodes will be high and which will be low.

Figure 1B:
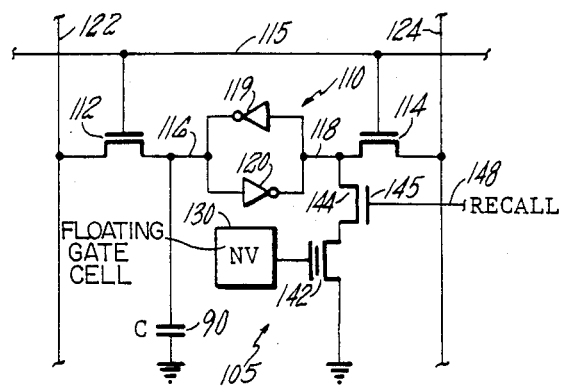

FIG. 1b illustrates an alternative approach, in which there is only the single capacitor 90 and there is an additional recall transistor 144 controlled by recall line 148 and connected between node 118 and floating-gate transistor 142. When floating-gate transistor 142 is turned off by non-volatile cell 130, this circuit behaves exactly as the circuit shown in FIG. 1a. When floating gate transistor 142 is turned on, and the recall signal from any conventional circuit has turned transistor 144 on, then there is a direct path between ground and node 118 and the circuit is forced to have node 118 low. This circuit reduces the possibility of a random fluctuation in current giving rise to false data, at the expense of the additional recall transistor.

Figure 2:
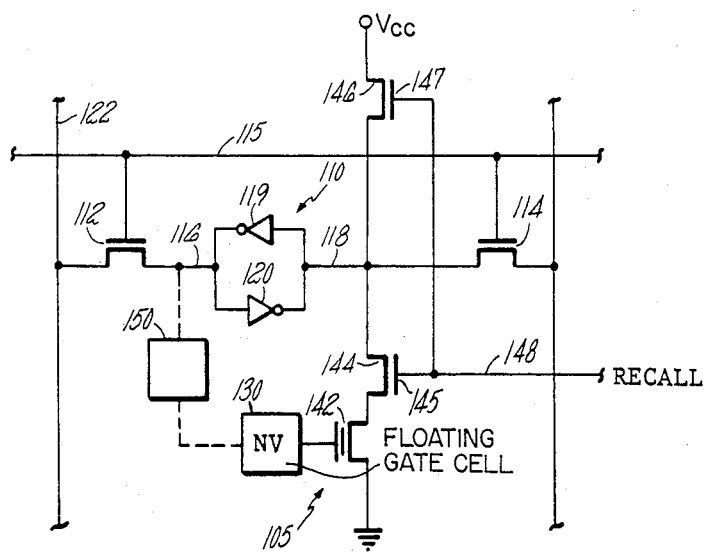
FIG. 2 illustrate a memory cell constructed according to the invention.

Referring now to FIG. 2, there is shown a shadow memory cell according to the invention, in which corresponding circuit elements have the same numerals as in FIGS. 1a and 1b. In this circuit, there is no capacitor tied to node 116 in volatile portion 110. The connection to node 118 is modified in that there are now two recall transistors 144 and 146, 144 being in the same position as shown in FIG. 1b and the new transistor 146 being connected between node 118 and the positive voltage terminal. Transistors 144 and 146 have gates 145 and 147 respectively, controlled by recall line 148. When non-volatile cell 130 has a zero voltage stored, so that floating-gate transistor 142 is turned off, there is no path between node 118 and ground and the current path between node 118 and VCC will dominate node 118, provided that the impedance of transistor 146 when it is turned on is below some threshold value. This threshold is such that transistor 146 will reliably dominate the output transistors of inverter 120. When non-volatile cell 130 stores a high voltage, so that floating-gate transistor 142 is turned on, then there is a second current path from node 118 to ground.

The voltage on node 118 will, of course, depend upon the impedance of the various paths: through transistor 146 to VCC, through inverter 120 to either VCC or ground, and through transistors 144 and 142 to ground.

Transistors 142 and 144 must be sized such that their current capacity dominates all other impedance paths in the case when transistor 142 is turned on. In an illustrative example, the transistors within inverters 119 and 120 have a width of five units while transistor 146 has a width of ten units and transistors 144 and 142 have a width of forty units. The units are arbitrary of course, since it is the ratios between the impedances of the different paths that are important.

Optional circuit 150 is shown as connecting node 116 with non-volatile cell 130. Box 150 is a schematic representation of a conventional storage circuit for storing data from volatile cell 110 in non-volatile cell 130. Such circuits are well known in the art and form no part of this invention, which is concerned with recalling the non-volatile data. If non-volatile cell 130 is a ROM cell, such as a transistor 142 that is programmed at the factory with fixed data, then circuit 150 will not be necessary. In that case cell 130 would simply be a connection to the gate of transistor 142 or an implant in transistor 142 to turn it permanently on or off.

Those skilled in the art will be able to apply the principles of the invention to other embodiments than that illustrated here.

Non-volatile cell 130 has been shown schematically and referred to as a tunnel oxide floating-gate cell, which is well known in the art. Any other non-volatile cell, such as a ROM cell, may be used to control transistor 142.

Any volatile memory cell having a node that can be forced into a voltage state may be used.

We claim:

1. A combined memory cell comprising:

a volatile memory cell having a volatile node for storing a predetermined voltage level, said volatile node having a volatile node impedance connected to one of a first and second current terminal;

a non-volatile memory cell for storing data;

a first data transfer transistor, connected to and having a gate electrode controlled by said non-volatile memory cell and connected between said second current terminal and an intermediate node; and a second data transfer transistor connected between said intermediate node and said volatile node and having a gate electrode connected to a recall signal terminal;

characterized in that said combined memory cell further comprises a third data transfer transistor connected between said volatile node and said first current terminal, said third data transfer transistor having a gate electrode connected to said recall signal terminal, and further characterized in that each of said first, second and third data transfer transistors has an impendance related by the conditions that, when said first data transistor is turned off by said non-volatile memory cell and said third data transfer transistor is turned on, said third data transfer transistor is able to force said volatile node to the voltage of the said first current terminal and that, when said first, second and third data transfer transistors are turned on, said second and third data transistors are able to force said volatile node to the voltage of said second current terminal.

2. A combined memory cell according to claim 1, in which said first current terminal supplies current at a power supply voltage and said second current terminal is ground.

3. A combined memory cell according to claim 2, in which said volatile memory cell is a static RAM memory cell and said non-volatile cell is permanently programmed with fixed data.

* * * * *